US010462924B2

(12) United States Patent
Mielnik et al.

(10) Patent No.: US 10,462,924 B2
(45) Date of Patent: Oct. 29, 2019

(54) RAIL-MOUNTED CONTROL SYSTEM WITH IMPROVED COOLING

(71) Applicant: ABB Schweiz AG, Baden (CH)

(72) Inventors: David Mielnik, Painesville, PA (US); Richard Ogorek, Sagamore Hills, OH (US); John Piunno, Painesville, PA (US); Thomas Heilman, Wickliffe, OH (US); Krzystof Miedza, Bay Village, OH (US); Daniel J. Morgan, Cleveland, OH (US); Mike J. Maczuzak, Bratenahi, OH (US)

(73) Assignee: ABB Schweiz AG, Baden (CH)

( * ) Notice: Subject to any disclaimer, the term of this patent is extended or adjusted under 35 U.S.C. 154(b) by 11 days.

(21) Appl. No.: 15/695,643

(22) Filed: Sep. 5, 2017

(65) Prior Publication Data

US 2017/0367208 A1 Dec. 21, 2017

Related U.S. Application Data

(63) Continuation of application No. PCT/US2016/020405, filed on Mar. 2, 2016.
(Continued)

(51) Int. Cl.
*H05K 7/14* (2006.01)
*H05K 7/20* (2006.01)
(Continued)

(52) U.S. Cl.
CPC ......... *H05K 7/1467* (2013.01); *H05K 7/1474* (2013.01); *H05K 7/20127* (2013.01);
(Continued)

(58) Field of Classification Search
CPC ............... H05K 7/1467; H05K 7/1474; H05K 7/20145; H05K 7/20127; H02B 1/052;
(Continued)

(56) References Cited

U.S. PATENT DOCUMENTS 6,081,425 A * 6/2000 Cheng .................. G06F 1/203
165/122
6,840,819 B2 * 1/2005 Bet ........................ H02B 1/052
439/157
(Continued)

FOREIGN PATENT DOCUMENTS

DE 2638118 A1 3/1978
EP 2073618 A1 6/2009
(Continued)

OTHER PUBLICATIONS

EPO machine translation of Becker EP 2073618.*
(Continued)

*Primary Examiner* — Jacob R Crum
(74) *Attorney, Agent, or Firm* — Taft Stettinius & Hollister LLP; J. Bruce Schelkopf

(57) ABSTRACT

A control system for mounting to a vertically-extending rail. The control system includes a plurality of bases, each having a channel formed therein that is adapted for mounting to the rail. A plurality of modules are provided for removable mounting to the bases, respectively. Each module has circuitry for processing control signals and a housing enclosing the circuitry. At least a bottom end of each housing has openings therein to permit air to flow into the housing and over the circuitry. A plurality of air flow deflectors are provided for mounting to the bases, respectively. When the modules and the air flow deflectors are mounted to the bases, the air flow deflectors form pockets with the bottom ends of the modules. The pockets have enlarged openings disposed parallel to sides of the modules.

22 Claims, 13 Drawing Sheets

Related U.S. Application Data

(60) Provisional application No. 62/127,145, filed on Mar. 2, 2015.

(51) Int. Cl.
*G05B 19/05* (2006.01)
*H01L 23/467* (2006.01)

(52) U.S. Cl.
CPC ....... *H05K 7/20145* (2013.01); *G05B 19/054* (2013.01); *G05B 2219/25079* (2013.01); *H01L 23/467* (2013.01)

(58) Field of Classification Search
CPC ........ G05B 19/054; G05B 2219/25079; H01L 23/467
USPC ........................... 361/679.46, 679.49–679.51
See application file for complete search history.

(56) References Cited

U.S. PATENT DOCUMENTS

| | | | | |
|---|---|---|---|---|
| 2004/0201972 A1* | 10/2004 | Walesa | ................. | H01R 25/164 361/788 |
| 2006/0104024 A1 | 5/2006 | Wang et al. | | |
| 2010/0268850 A1* | 10/2010 | Burton | ................. | G06F 13/409 710/3 |
| 2010/0314522 A1* | 12/2010 | Molnar | ................. | H02B 1/052 248/346.06 |
| 2012/0106058 A1* | 5/2012 | Chin | .................... | H05K 7/1467 361/679.4 |
| 2012/0181866 A1 | 7/2012 | Abert et al. | | |
| 2014/0168886 A1* | 6/2014 | Tian | ........................ | G06F 1/20 361/679.46 |
| 2014/0177170 A1* | 6/2014 | Steffen | ................. | G08B 17/00 361/692 |

FOREIGN PATENT DOCUMENTS

| | | |
|---|---|---|
| EP | 2385753 A2 | 11/2011 |
| EP | 2736062 A1 | 5/2014 |
| JP | 2902213 B2 | 6/1999 |

OTHER PUBLICATIONS

International Search Report and Written Opinion, PCT/EP2016/020405, ABB Technology AG, dated Jun. 9, 2016, 10 pages.

\* cited by examiner

RAIL-MOUNTED CONTROL SYSTEM WITH IMPROVED COOLING

CROSS-REFERENCE TO RELATED APPLICATION

The present application claims the benefit of the filling date of U.S. Provisional Application Ser. No. 62/127,145 filed on Mar. 2, 2015.

BACKGROUND

The present invention relates to industrial control systems and more particularly to industrial control systems having rail-mounted controller and input/output modules with improved cooling.

Industrial control systems, such as distributed control systems, often include one or more controllers that utilize input signals from field devices, such as flow meters, to provide control output signals to final control elements, such as valves, in order to control a process or one or more sub-processes. Such control systems are typically module-based and include one or more controller modules and one or more input/output (I/O) modules through which the controller module receives and sends input and output signals from and to the field, respectively. The controller module and I/O modules are often mounted to a rail, such as a DIN rail. Conventionally, the rail is mounted horizontally, with the modules being mounted thereto so as to be arranged in a side-by-side manner. The modules are cooled by providing adequate spacing horizontally between the individual modules and vertically between the different rows of modules. Fans may also be provided to improve air flow. However, adequate spacing is often difficult to obtain and fans are often not desirable.

SUMMARY

In accordance with the present disclosure, a control system is provided for mounting to a rail. In certain embodiments, the control system includes a base having a mounting structure, a socket, and a body with a channel formed therein that is adapted to receive the rail. A module is adapted for removable mounting to the socket of the base. The module includes circuitry for processing control signals and a housing enclosing the circuitry. The housing has first and second sides and first and second ends. At least the first end has openings therein to permit fresh air to flow into the housing and over the circuitry.

In one embodiment, an air flow deflector is adapted for mounting to the mounting structure of the base. The air flow deflector includes at least one wall defining a recess and has an outer peripheral edge with portions disposed on opposing sides of the recess. When the module is mounted to the socket of the base and the air flow deflector is mounted to the mounting structure of the base, the outer peripheral edge is disposed adjacent to the first end of the module such that the air flow deflector forms a pocket with the first end of the module. The pocket has a trash air inlet opening disposed in a plane that is at least substantially parallel to the side of the module to receive the fresh air flow while the blocking wall can block warm air from an adjacent module.

This summary is provided to introduce a selection of concepts that are further described below in the illustrative embodiments. This summary is not intended to identify key or essential features of the claimed subject matter, nor is it intended to be used as an aid in limiting the scope of the claimed subject matter. Further embodiments, forms, objects, features, advantages, aspects, and benefits shall become apparent from the following description and drawings.

BRIEF DESCRIPTION OF THE DRAWINGS

The features, aspects, and advantages of the present invention will become better understood with regard to the following description, appended claims, and accompanying drawings where;

DETAILED DESCRIPTION OF ILLUSTRATIVE EMBODIMENTS

Figure 1:
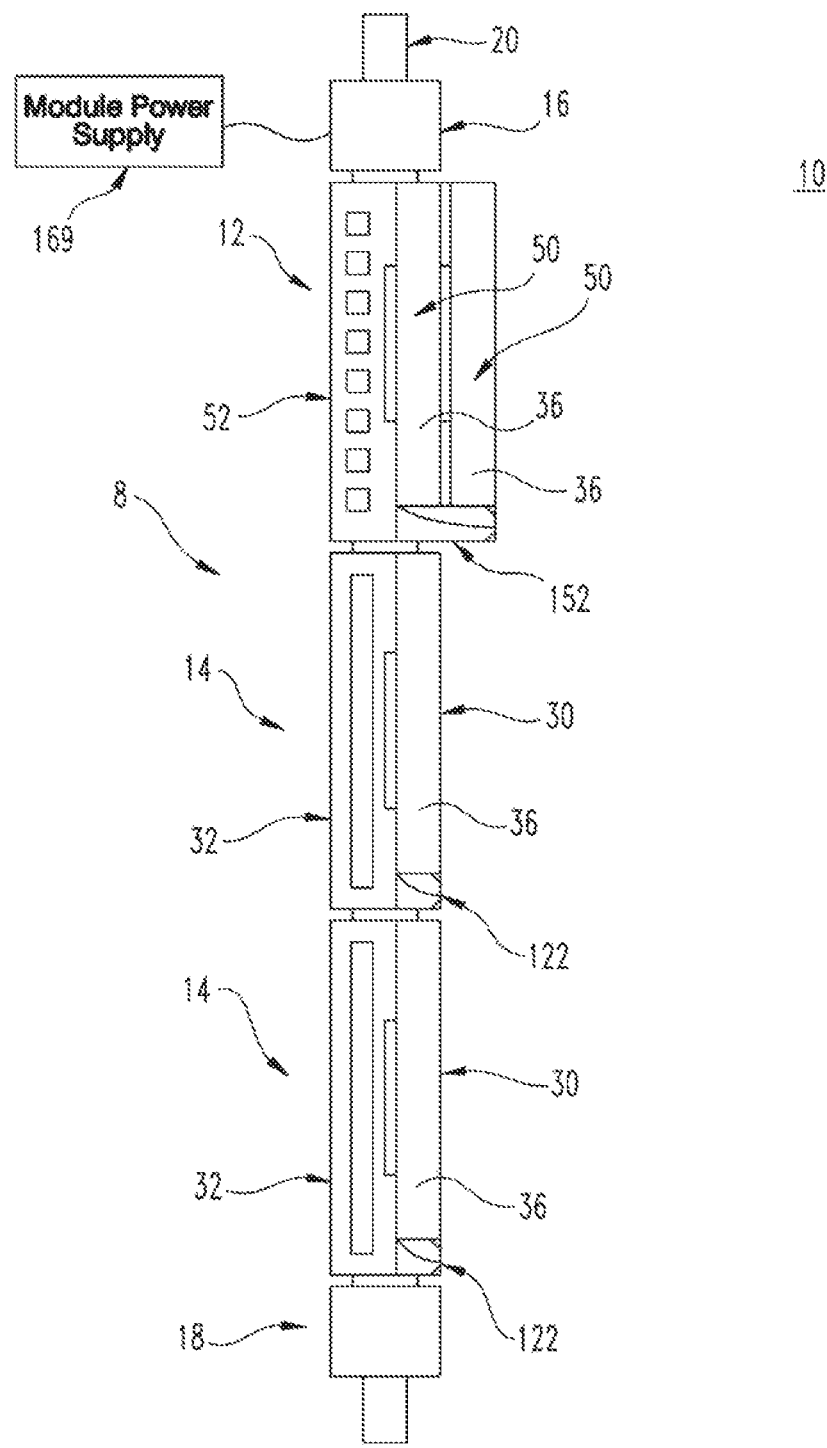
FIG. 1 shows a schematic view of a control system mounted to a rail.

It should be noted that in the detailed description that follows, identical components have the same reference numerals, regardless of whether they are shown in different embodiments of the present invention. It should also be noted that in order to clearly and concisely disclose the present invention, the drawings may not necessarily be to scale and certain features of the invention may be shown in somewhat schematic form.

Referring now to FIG. 1, there is shown a module row 8 of a node of an industrial control system 10. The module row 8 comprises a controller assembly 12, a plurality of I/O assemblies 14 and top and bottom end modules 16, 18 connected to each other and mounted to a vertically-extending top hat DIN rail 20. The module row 8 may have a different number of I/O assemblies 14 and may include a single controller, instead of a redundant controller, as described more fully below. Indeed, the module row 8 typically includes substantially more I/O assemblies 14. In addition, the node may include one or more additional module rows comprising one or more I/O assemblies 14 and first and second end modules 16, 18. Each additional module row may be mounted to a separate vertically-extending DIN rail 20. The node may be used to control all or a portion of an industrial process, such as a power generation process. Further, the node may be connected to other nodes of the industrial control system, as described more fully below. The module row 8 and other module rows of the control system 10 may be mounted in an enclosure such as a cabinet.

Each I/O assembly 14 handles a plurality of inputs or a plurality of outputs. A typical control system has one or more I/O assemblies 14 handling inputs and one or more I/O assemblies 14 handling outputs. The inputs may be analog inputs, digital inputs, thermocouple inputs or RTD inputs. The outputs may be analog outputs or digital outputs. The inputs and outputs (I/O) are typically powered by the sensors and control elements in the field. However, digital outputs may be powered by the I/O assembly 14, such as when the digital outputs are used to energize relay coils.

Figure 3:
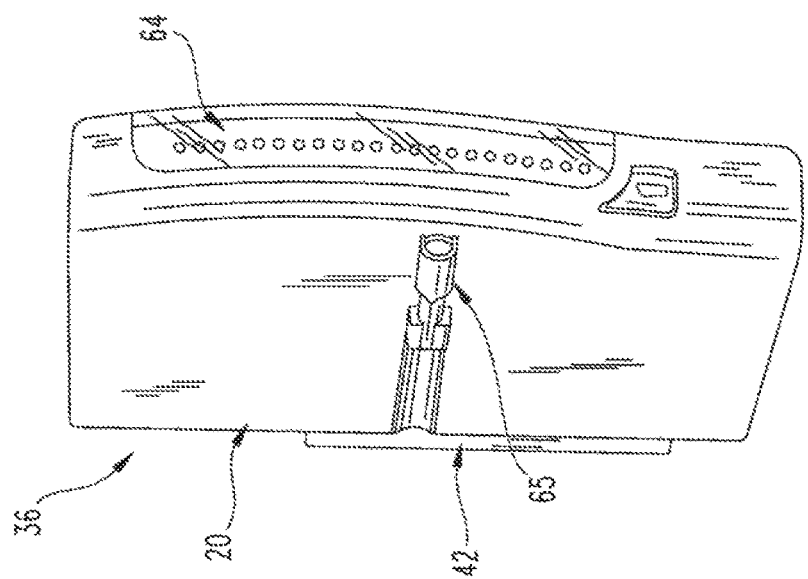
FIG. 3 shows a front left perspective view of the housing.
Figure 2:
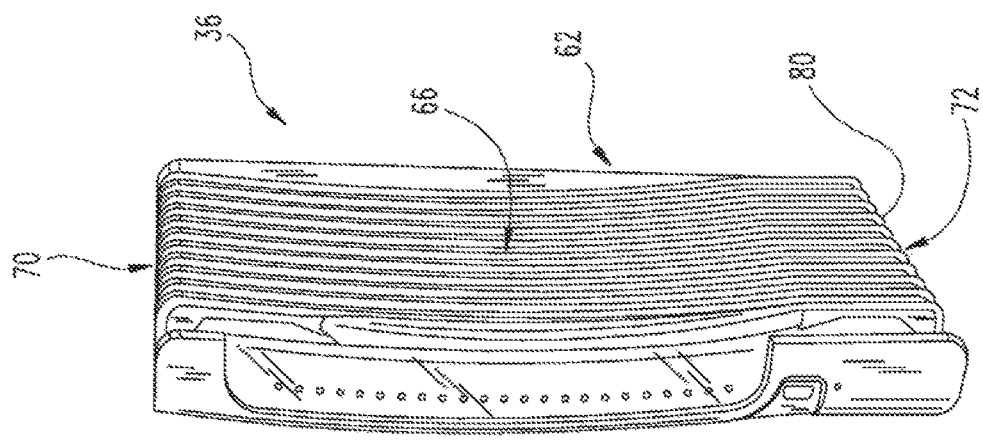
FIG. 2 shows front right perspective view of a housing of a controller module or an I/O module of the control system.
Figure 5:
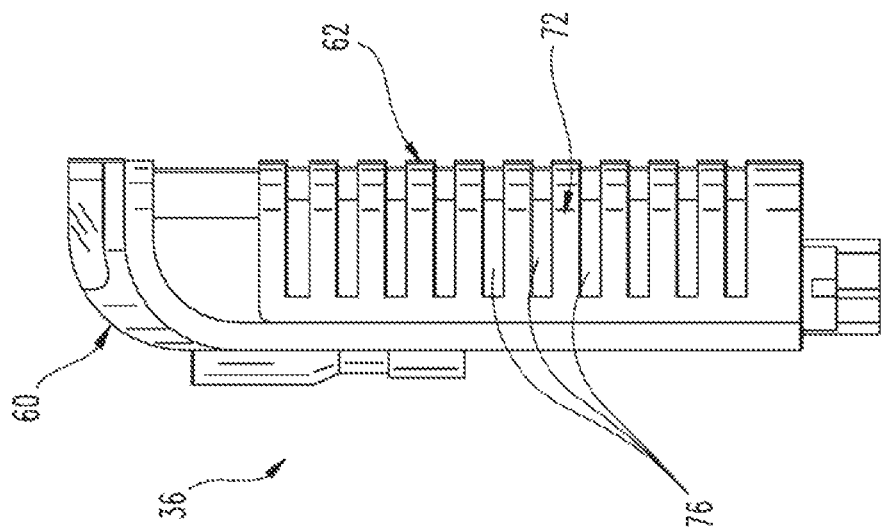
FIG. 5 shows a bottom plan view of the housing.
Figure 4:
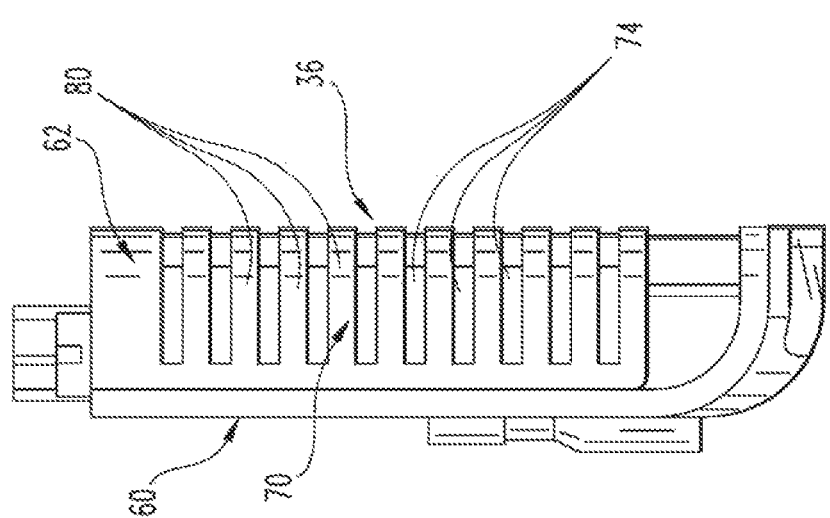
FIG. 4 shows a top plan view of the housing.

Each I/O assembly 14 comprises an I/O module 30 releasably mounted to an I/O base 32. Each I/O module 30 includes a two-piece plastic outer housing 36 enclosing one or more circuit boards. The housing 36 defines a rear plug 42 (shown in FIG. 3) within which is disposed a connecting portion of the circuit board(s). Circuitry on the circuit board(s) processes field inputs received from sensors in the field or control outputs received from the controller assembly 12, depending on whether the I/O module 30 handles inputs or outputs. More specifically, the circuitry converts between field signals (e.g., analog 4-20 mA, digital 24 VDC etc.) and digital controller signals, such as by using analog-to-digital and/or digital-to-analog converters. The circuitry also conditions the signals received from or going to the field, such as by using switches, filters and multiplexers, and isolates the field signals from the controller assembly 12.

The controller assembly 12 includes a pair of redundant controller modules 50 releasably mounted to a controller base 52. Each of the controller modules 50 has a construction similar to each I/O module 30 and includes one or more circuit boards mounted inside a two-piece plastic outer housing 36. A connecting portion of the circuit board(s) is disposed within the rear plug 42 of the outer housing 36 of each controller module 50. The circuit board(s) in each controller module 50 includes a microprocessor, memory and other circuitry. The memory stores control programs that may be executed by the microprocessor of each controller module 50. The control programs in each controller module 50 include one or more control loops, such as PID loops, which work on one or more field inputs to generate control outputs. The field inputs and control outputs are routed to and from the controller assembly 12 through the I/O assemblies 14 via a module communication bus, which extends through and is formed by the I/O bases 32. Each controller module 50 is programmed with and can execute the same control programs; however, only one of the controller modules 50 (the primary) executes the control programs to control the industrial process at any one time. If the primary controller module 50 fails, the other controller module 50 (the secondary) automatically takes over and executes the control programs to control the industrial process.

Reference is now made to FIGS. 2, 3, 4 and 5. As set forth above, each I/O module 30 and each controller module 50 includes an outer housing 36. The outer housing 36 comprises a first section 60 and a second section 62. The first section 60 has a closed exterior (i.e., no openings) and includes a window 64 through which status LEDs may be viewed. A side mount 65 is fixed to a side wall of the first section 60. The second section 62 has a side wall 66 extending between and top and bottom ends 70, 72. A series of top openings 74 extend through the top end 70, while a series of bottom openings 76 extend through the bottom end 72. A series of ridges 80 separate both the top openings 74 and the bottom openings 76. The ridges 80 extend over the top end 70, along the side wall 66 and over the bottom end 72. The top and bottom openings 74, 76 permit air to flow through the housing 36 to cool the electronic components mounted on the circuit board(s) disposed therein. More specifically, air enters the housing 36 through the bottom openings 76, passes over the circuit board(s) and exits the housing 36 through the top openings 74.

As set forth above, each of the I/O modules 30 is mounted to an I/O base 32. The I/O bases 32 are adapted for releasably secure mounting to the DIN rail 20.

Figure 6:
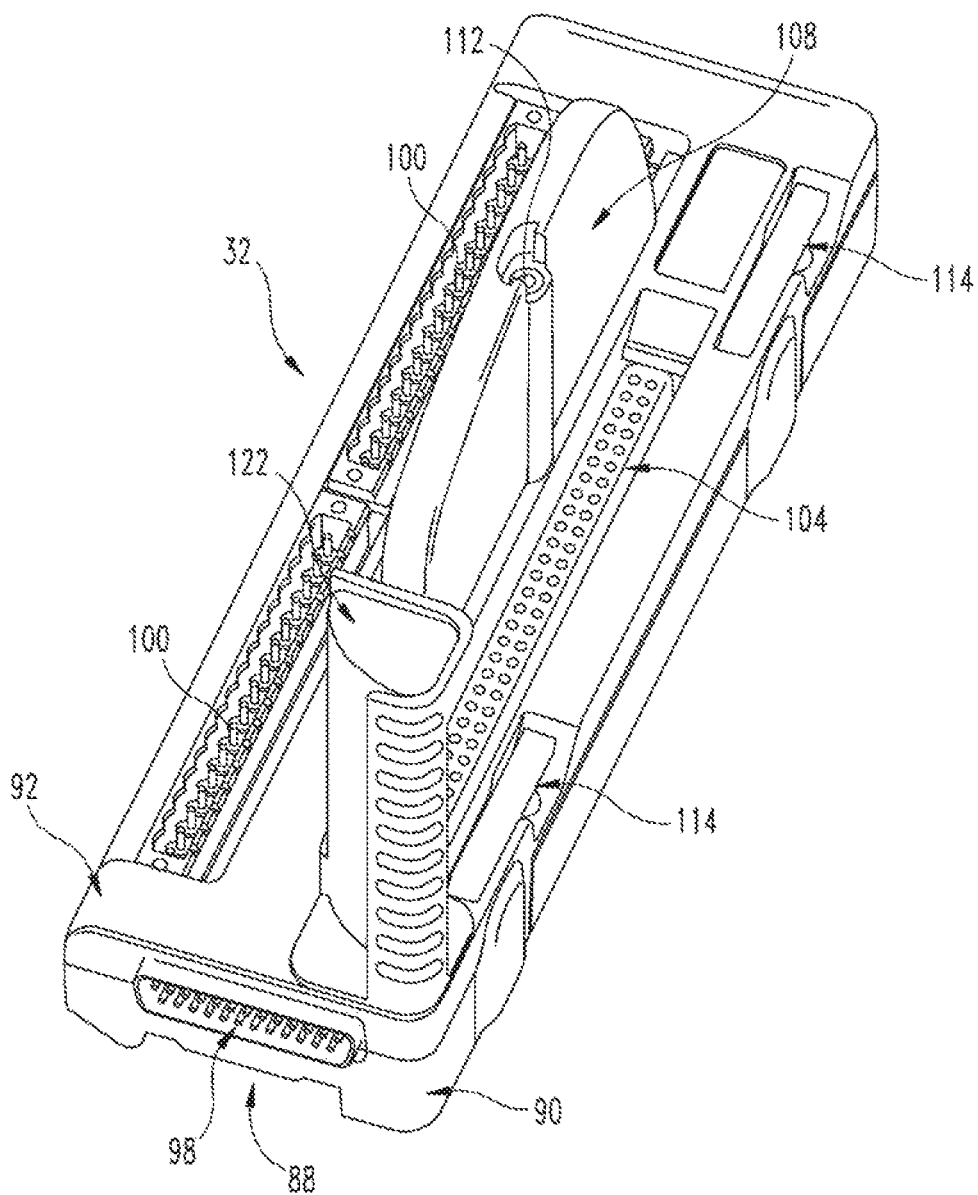
FIG. 6 shows a front perspective view of an I/O base of the control system.
Figure 7:
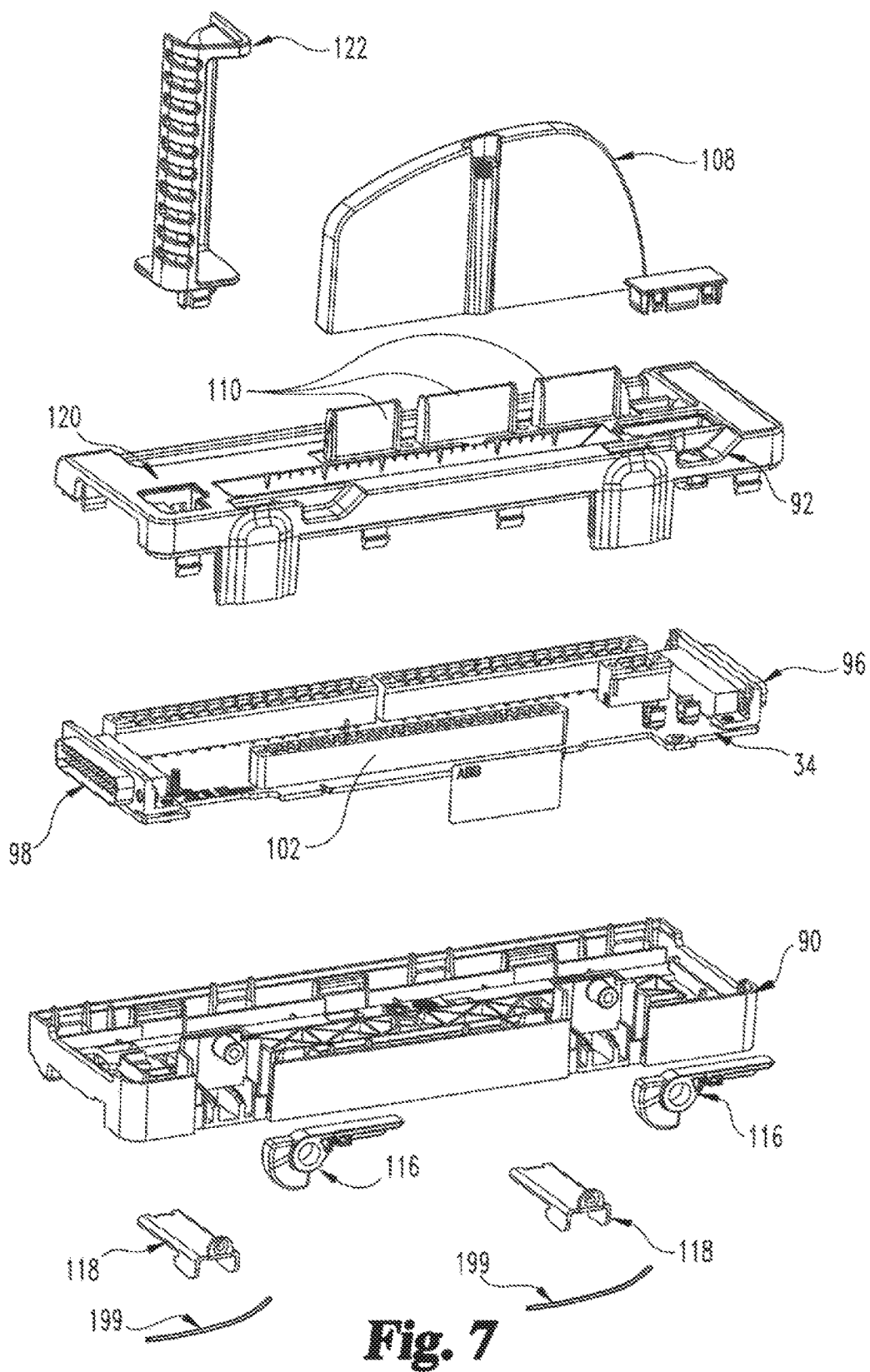
FIG. 7 shows an exploded view of the I/O base.

Referring now to FIGS. 6 and 7, each I/O base 32 is rectangular and is generally comprised of a circuit board 34 disposed between and enclosed by a mounting structure 90 and a cover 92. A vertically extending channel 88 is formed in a rear side of the mounting structure 90. The channel 88 is adapted for receiving the DIN rail 20. A power connector extends from the front side of the I/O base 32 and is electrically connected to the circuit board 34. The power connector is adapted for connection to a supply of power (e.g. 24 VDC) for powering digital outputs, as described above.

Top and bottom pin connectors 96, 98 extend from top and bottom ends of the I/O base 32, respectively. The top and bottom pin connectors 96, 98 are mounted to, and connected together, by the circuit board 34. Together, the circuit board 34 and the top and bottom pin connectors 96, 98 help form the module communication bus, as well as a module power bus. The top pin connector 96 of an I/O base 32 is adapted to engage and connect to a bottom pin connector 98 of another, adjacent I/O base 32, or to a bottom pin connector 138 of a controller base 52. In this manner, a plurality of I/O bases 32 may be connected together to form a series of I/O bases 32 through which the module bus and the power bus extend.

A first enlarged opening, generally rectangular in shape, extends through the cover 92 of the I/O base 32 and into its interior. A pair of connectors 100 are disposed in the first enlarged opening and are mounted to the circuit board 34 inside the I/O base 32. Each connector 100 is adapted to receive, in a plug-in type manner, a plug of a terminal block or a plug of a marshaling cable. In this manner, a pair of terminal blocks or plugs of a pair of marshaling cables, or one terminal block and one plug of a marshaling cable may be removably mounted to the I/O base 32. Screws may be used releasably fasten a terminal block or a marshaling cable plug to a connector 100. The terminal blocks provide connections for field wiring connected to field devices, such as transmitters and actuators. Marshaling cables provide connections to marshaling enclosures, inside of which connections to field wiring are made.

A second enlarged opening, generally rectangular in shape, extends through the cover 92 and into the interior of the I/O base 32. A circuit board connector 102 connected to the circuit board 34 is disposed in and accessible through the second enlarged opening. The enlarged opening and the connector 102 form a socket 104 for receiving the plug 42 and the connecting portion of the circuit board of an I/O module 30.

A mounting wall or hump 108 is secured over posts 110 extending outwardly from the cover 92. A threaded bore insert 112 is secured inside the hump 108 at the bottom of a socket formed at the top of the hump 108. The socket is configured to receive a portion of a side mount 65 of a housing 36 of an I/O module 30. When a side mount 65 is so disposed in the socket, a screw may be inserted through the side mount 65 and threadably received in the threaded bore insert 112, thereby releasably securing the I/O module 30 to the hump 108 and, thus, the I/O base 32.

A pair of smaller openings are disposed adjacent to the socket 104. Levers 116 of a pair of latching assemblies 114 are movably mounted within the smaller openings, respectively. Each latching assembly 114 further includes a shuttle 118 operably connected to the lever 116 and a spring wire 199 connected to each shuttle 118 to bias shuttle 118 toward an engaged position with rail 20. Each lever 116 is movable between a latched position and an unlatched position. In the latched position, the lever 116 is disposed substantially flush with the front side (as shown in FIG. 6), whereas in the unlatched position, the lever 116 extends outward from the front side. Movement of the lever 116 is operable to move the shuttle 118, which is movably mounted inside the mounting structure 90, adjacent to the channel 88. The shuttle 118 is moved by the lever 116 into and onto of engagement with the DIN rail 20 when it is disposed in the channel 88 to respectively secure and release the I/O base 32 from the DIN rail 20. More specifically, when the lever 116 is in the unlatched position, the shuttle 118 does not engage the DIN rail 20, whereas when the lever 116 is in the latched position, the shuttle 118 engages the DIN rail 20. In this manner, the I/O base 32 is secured and released from the DIN rail 20.

In order to mount an I/O module 30 to the I/O base 32, the levers 116 are pieced in the latched position and then the plug 42 of the I/O module 30 is inserted into the socket 104, while the side mount 65 of the I/O module 30 is inserted into the socket of the hump 108. A screw is then inserted through the side mount 65 and threaded into the bore insert 112 of the hump 108. When the I/O module 30 is so mounted to the I/O base 32, the I/O module 30 is disposed over the levers 116 (which are in the latched positions). From this description, it should be appreciated that the I/O base 32 is mounted to the DIN rail 20 without the I/O module 30 being mounted thereto in order to permit the levers 116 to be manually manipulated.

A mounting opening 120 is formed in the cover 92, toward a lower right corner thereof. The mounting opening 120 is configured to receive, in a snap-fit manner, mounting projections of a (single wide) air deflector 122 so as to releasably secure the air deflector 122 to the I/O base 32. When the air deflector 122 and an I/O module 30 are mounted to the I/O base 32, the air deflector 122 extends across the width of the I/O module 30 and covers the bottom openings 76 thereof. The air deflector 122 is constructed to direct air from a direction to the right of the I/O base 32 (as viewed from FIG. 1) into the bottom openings 76 of the I/O module 30 mounted to the I/O base 32 and to direct air exiting the top openings 74 of another I/O module 30 located below the I/O base 32 to the left of the I/O base 32 and away from the bottom openings 76 of the I/O module 30 mounted to the I/O base 32. Moreover, the air deflector 122 acts as a shield to prevent warm air exiting the I/O module 30 located below the I/O base 32 from entering the bottom openings 76 of the I/O module 30 mounted to the I/O base 32.

Figure 8:
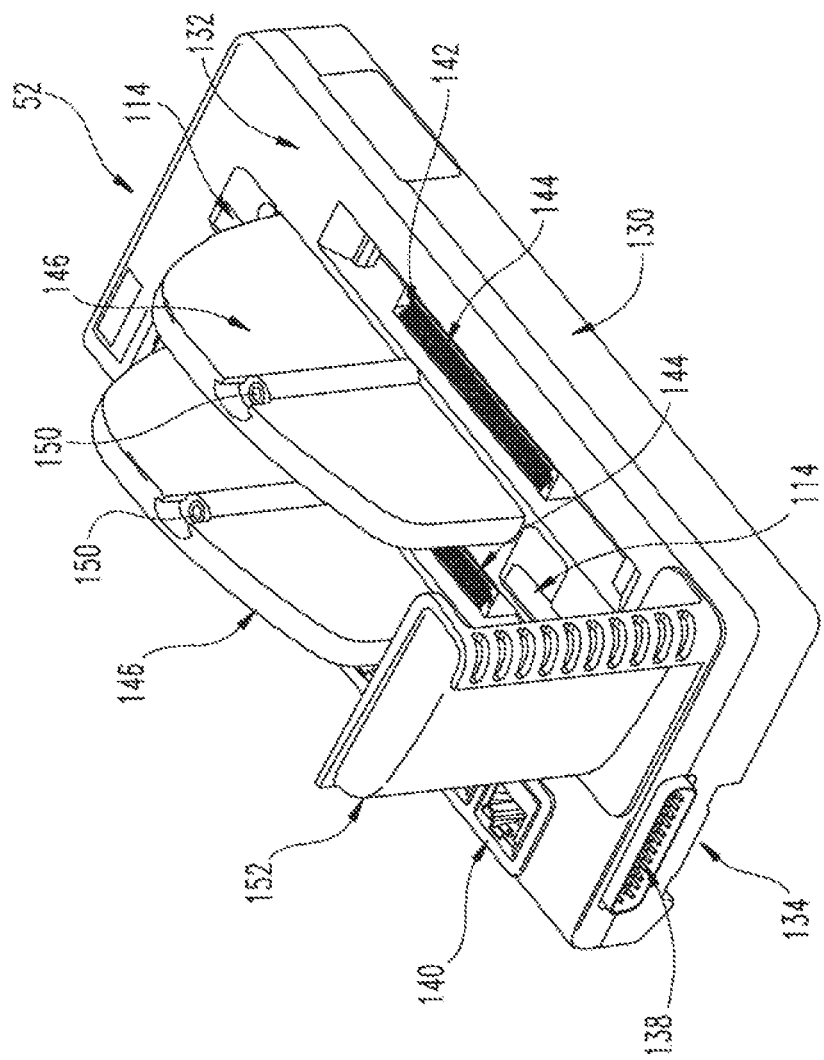
FIG. 8 shows a front perspective view of a controller base of the control system.
Figure 9:
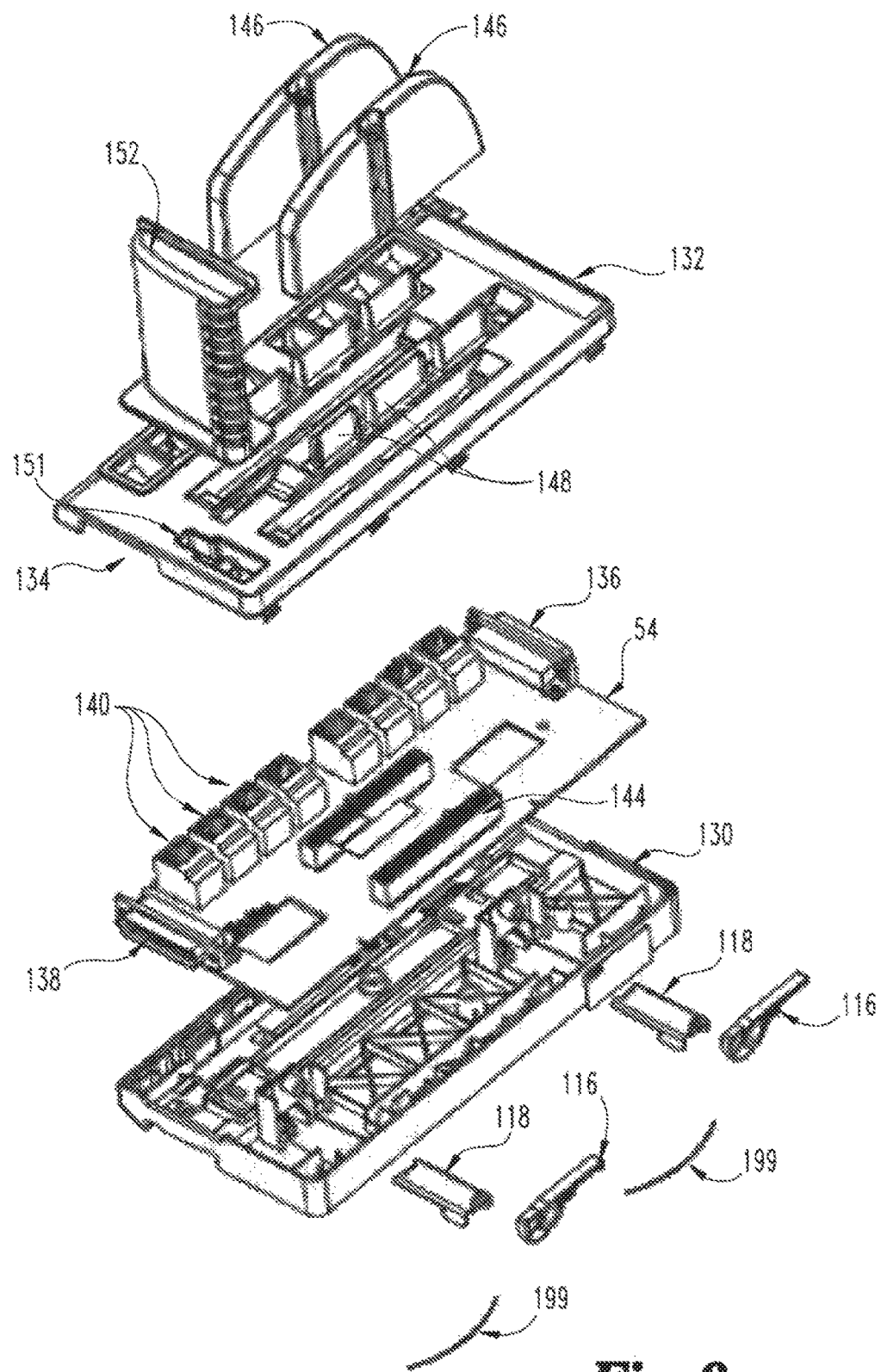
FIG. 9 shows an exploded view of the controller base.

Referring now to FIGS. 8 and 9, the controller base 52 is also rectangular, but is substantially wider than an I/O base 32 because it mounts two (controller) modules. Similar to the I/O base 32, the controller base 52 is generally comprised of a circuit board 54 disposed between and enclosed by a mounting structure 130 and a cover 132. A vertically extending channel 134 is formed in a rear side of the mounting structure 130. The channel 130 is adapted for receiving the DIN rail 20.

Top and bottom pin connectors 136, 138 extend from top and bottom ends of the controller base 52, respectively. The top and bottom pin connectors 136, 138 are mounted to, and connected together, by the circuit board 54. Together, the circuit board 54 and the top and bottom pin connectors 136, 138 help form the module communication bus, as well as the module power bus. The bottom pin connector 138 of the controller base 52 is adapted to engage and connect to a top pin connector 96 of an adjacent I/O base 32. In this manner, the controller base 52 can be connected to and communicate with a series of I/O bases 32.

A series of rectangular openings extend through the cover 132 of the controller base 52 and into its interior. Ethernet jacks 140 are disposed in the openings, respectively, and are mounted to the circuit board 54 inside the controller base 52. The Ethernet jacks 140 are adapted to receive plugs of Ethernet cables, respectively. When the controller modules 50 are connected to the controller base 52, the Ethernet jacks 140 are connected to an Ethernet foreign device interface in the controller modules 50. In this manner, the controller modules 50 can communicate with other devices over Ethernet cables plugged into the Ethernet jacks 140. More specifically, the controller modules 50 can communicate with other controller modules 50 (in other nodes) similarly connected to the Ethernet cables, and/or with operator workstations connected to the Ethernet cables. The controllers 50 may use a protocol, such as Modbus TCP, to communicate with other devices connected to the Ethernet cables.

A pair of enlarged openings, each generally rectangular in shape, extend through the cover 132 and extend into the interior of the controller base 52. A pair of circuit board connectors 142 connected to the circuit board 54 are disposed in and accessible through the enlarged openings, respectively. The enlarged openings and the connectors 142 form sockets 144 for receiving the plugs 42 and the connecting portions of the circuit boards of the controller modules 50, respectively.

A pair of mounting walls or humps 146 are secured over posts 148 extending outwardly from the cover 132. The humps 146 are provided to secure the controller modules 50 to the controller base 52. As such, one of the humps 146 is disposed between the sockets 144. A threaded bore insert 150 is secured inside each hump 146 at the bottom of a socket formed at the top of the hump 146. The socket in each hump 146 is configured to receive a portion of a side mount 65 of a housing 36 of a controller module 50. When a side mount 65 is so disposed in the socket, a screw may be inserted through the side mount 65 and threadably received in the threaded bore insert 150, thereby releasably securing the controller module 50 to the hump 146 and, thus, the controller base 52.

A pair of smaller openings are disposed between a leftmost one of the sockets 144 and a rightmost one of the humps 146. Levers 116 of a pair of latching assemblies in the controller base 52 are movably mounted within the smaller openings, respectively. The latching assemblies have the same construction as those described above in the I/O base 32. Thus, the controller base 52 is secured to and released from the DIN rail 20 by moving the levers 116 between the latched and unlatched positions, as with the I/O bases 32.

In order to mount a leftmost one of the controller modules 50 to the controller base 52, the levers 116 are placed in the latched position and then the plug 42 of the leftmost one of the controller modules 50 is inserted into the leftmost one of the sockets 144, while the side mount 65 of the leftmost one of the controller modules 50 is inserted into the socket of the leftmost one of the humps 146. A screw is then inserted through the side mount 65 and threaded into the bore inserts 150 of the leftmost one of the humps 146. When the leftmost one of the controller modules 50 is so mounted to the controller base 52, the leftmost one of the controller modules 50 is disposed over the levers 116 (which are in the latched positions). From this description, it should be appreciated that the controller base 52 is mounted to the DIN rail 20 without the leftmost one of the controller modules 50 being mounted thereto in order to permit the levers 116 to be manually manipulated.

Unlike the leftmost one of the controllers 50, the rightmost one of the controllers 50 may be mounted to the controller base 52 before the controller base 52 is mounted to the DIN rail 20.

A mounting opening 151 is formed in the cover 132, toward a lower right corner thereof. The mounting opening 151 is configured to receive, in a snap-fit manner, mounting projections of a (double wide) air deflector 152 so as to releasably secure the air deflector 152 to the controller base 52. When the air deflector 152 and a pair of controller modules 50 are mounted to the controller base 52, the air deflector 152 extends across the widths of both controller modules 50 and covers the bottom openings 76 thereof. The air deflector 152 is constructed to direct air from a direction to the right of the controller base 52 (as viewed from FIGS. 1 and 8) into the bottom openings 76 of the controller modules 50 mounted to the controller base 52 and to direct air exiting the top openings 74 of an I/O module 30 located below the controller base 52 to the left of the controller base 52 and away from the bottom openings 76 of the controller modules 50 mounted to the controller base 52. Moreover, the air deflector 152 acts as a shield to prevent warm air exiting the I/O module 30 located below the controller base 52 from entering the bottom openings 76 of the controller modules 50 mounted to the controller base 52.

Figure 10:
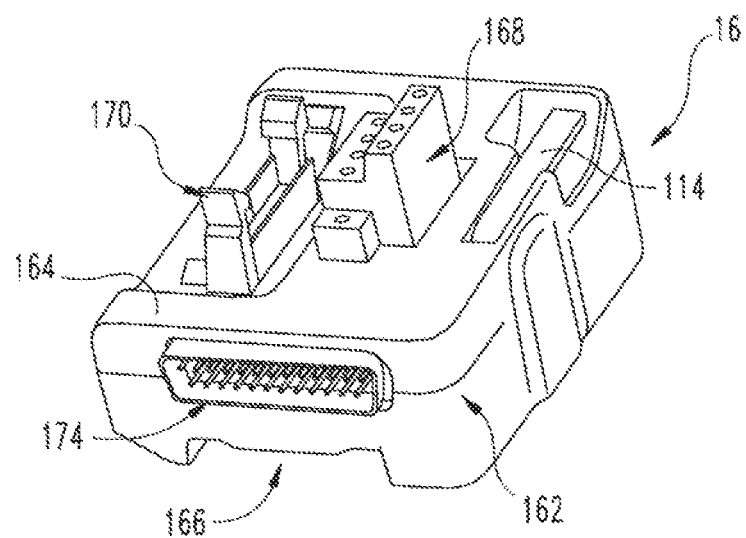
FIG. 10 shows a front perspective view of a top end module of the control system.
Figure 12:
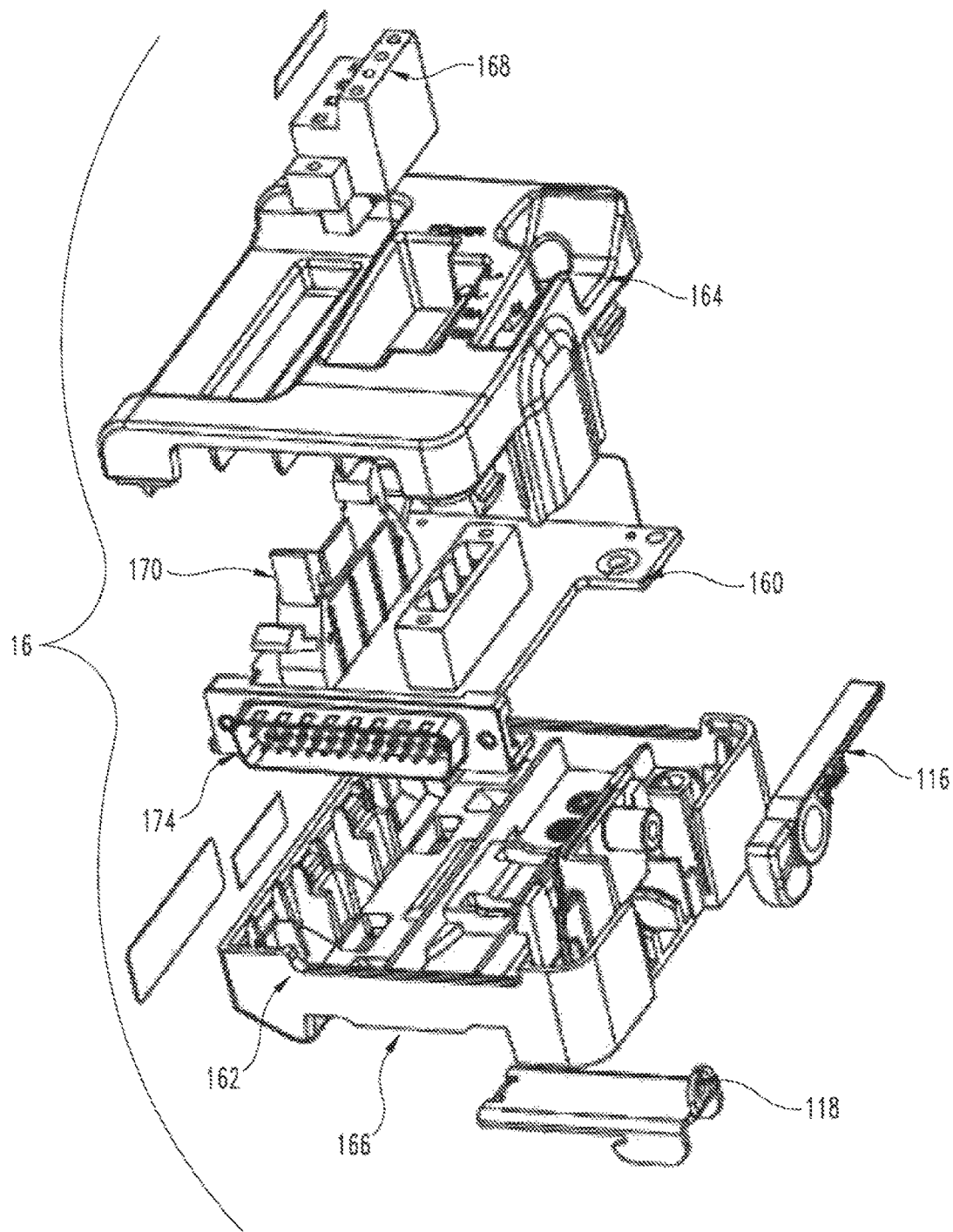
FIG. 12 shows an exploded view of the top end module.

Referring now to FIGS. 10 and 12, the top end module 16 is square and is generally comprised of a circuit board 160 disposed between and enclosed by a mounting structure 162 and a cover 164. A vertically extending channel 166 is formed in a rear side of the mounting structure 162. A power connector 168 is connected to the circuit board 160 and extends through an opening in the cover 164. The power connector 168 is provided for connection to a module power supply 169 (shown in FIG. 1). A communication connector 170 is also connected to the circuit board 160 and extends through an opening in the cover 164. A bottom pin connector 174 is mounted to the circuit board 160 and extends from a bottom side of the top end module 16. The bottom pin connector 174 is adapted to engage and connect to the top pin connector 136 of the controller base 52. The communication connector 170 and the power connector 168 are connected to the bottom pin connector 174 via the circuit board 160 inside the top end module 16. In this manner, the power connector 168 and the communication connector 170 are connected to the module communication bus and the module power bus when the bottom pin connector 174 of the top end module 16 is connected to the top pin connector 136 of the controller base 52. Thus, the module power supply provides power to the module bus through its connection to the power connector 168.

An opening is formed in the cover 164, toward the top and right side of the cover 164. A lever 116 of a latching assembly in the top end module 16 is movably mounted within the opening. The latching assembly has the same construction as that described above in the I/O bases 32. Thus, the top end module 16 is secured to and released from the DIN rail 20 by moving the lever 116 between the latched and unlatched positions, as with the I/O bases 32.

Figure 11:
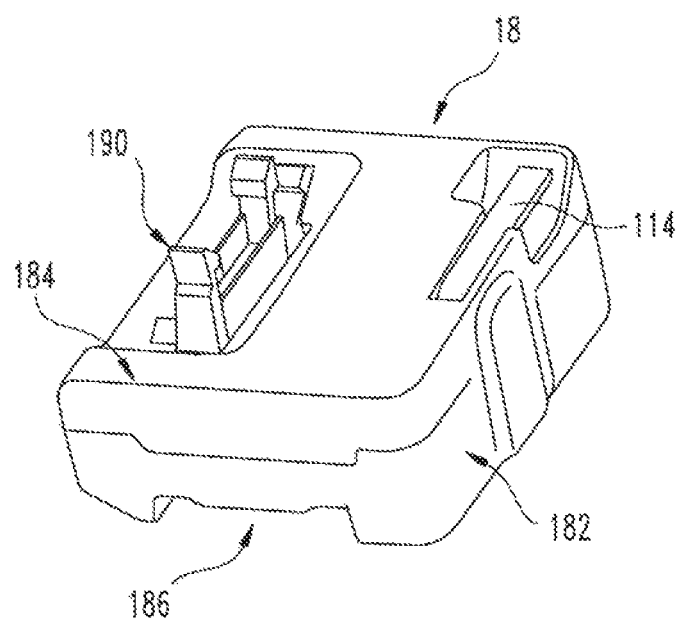
FIG. 11 shows a front perspective view of a bottom end module of the control system.
Figure 13:
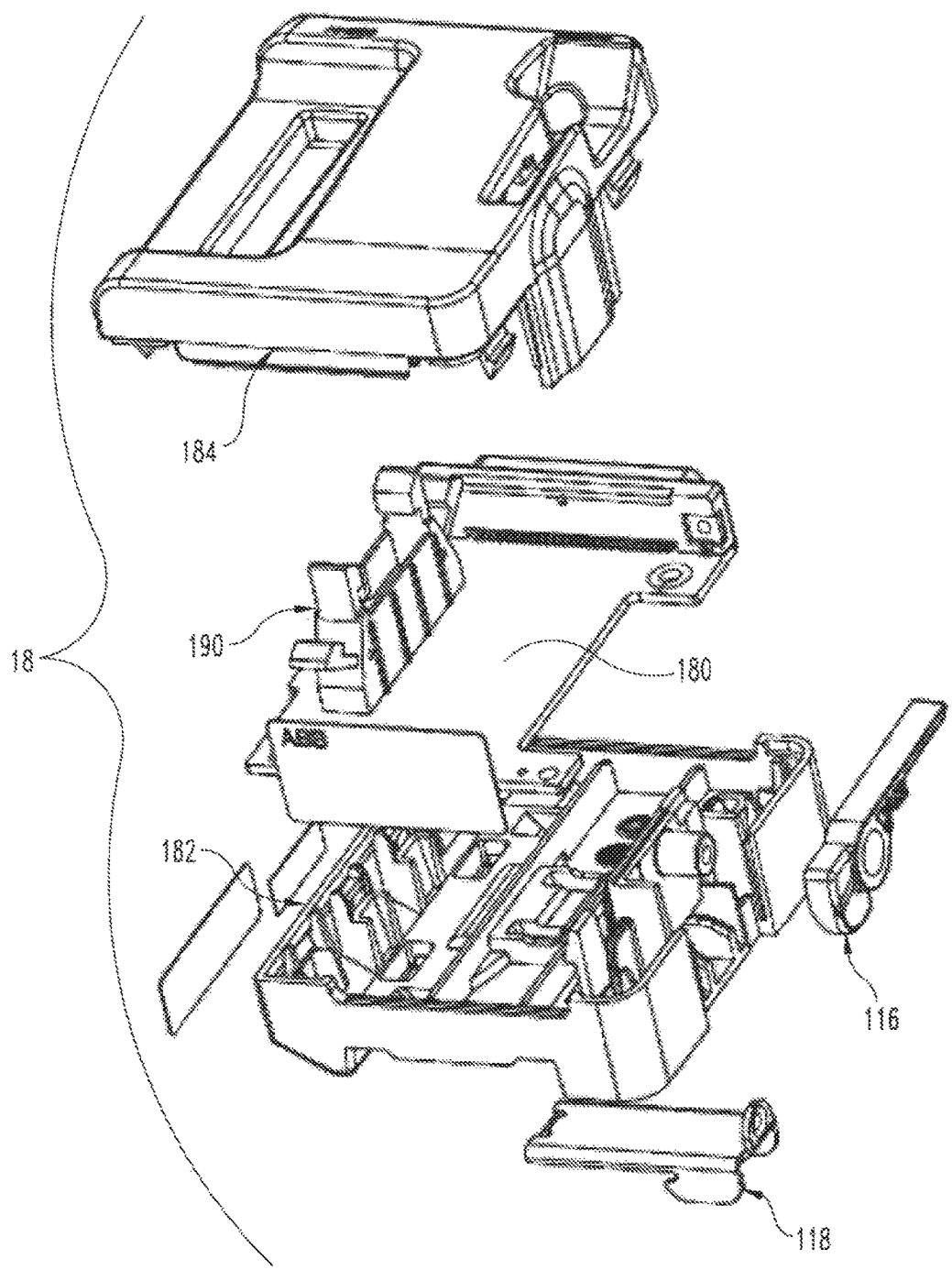
FIG. 13 shows an exploded view of the bottom end module.

Referring now to FIGS. 11 and 13, the bottom end module 18 is also square and is generally comprised of a circuit board 180 disposed between and enclosed by a mounting structure 182 and a cover 184. A vertically extending channel 186 is formed in a rear side of the mounting structure 182. A communication connector 190 is connected to the circuit board 180 and extends through an opening in the cover 184. A top pin connector 192 is mounted to the circuit board 180 and extends from a top side of the bottom end module 18. The top pin connector 192 is adapted to engage and connect to the bottom pin connector 98 of an I/O base 32. The communication connector 190 is connected to the top pin connector 192 via the circuit board 180 inside the bottom end module 18. The top pin connector 192 is connected to the module communication bus and the module power bus. The communication connector 190 permits the module row 8 to be connected to a second module row comprising top and bottom end modules 16, 18 and one or more I/O assemblies 14. In such an arrangement, the communication connector 190 of the bottom end module 18 in the module row 8 is connected by a cable to the communication connector 170 in a top end module 16 of the second module row. However, if the module row 8 is not connected to a second module row, a circuit board is plugged into the communication connector 190 to close the module bus.

An opening is formed in the cover 184, toward the top and right side of the cover 184. A lever 116 of a latching assembly in the bottom end module 18 is movably mounted within the opening. The latching assembly has the same construction as that described above in the I/O bases 32. Thus, the bottom end module 18 is secured to and released from the DIN rail 20 by moving the lever 116 between the latched and unlatched positions, as with the I/O bases 32.

Referring back to FIG. 1, within the module row 8, the top end module 16, the controller assembly 12, two I/O assemblies 14 and the bottom end module 18 are mounted to the DIN rail 20. As such, the DIN rail 20 extends through the channel 166 of the top end module 16, the channel 134 of the controller assembly 12, the channels 88 of the two I/O assemblies 14 and the channel 186 of the bottom end module 18. The bottom pin connector 174 of the top end module 16 is connected to the top pin connector 136 of the controller base 52, the top pin connector 96 of a top one of the I/O bases 32 is connected to the bottom pin connector 138 of the controller base 52, the bottom pin connector 98 of the top one of the I/O bases 32 is connected to a top pin connector 96 of a lower one of the I/O bases 32, and the top pin connector 192 of the bottom end module 18 is connected to the bottom pin connector 98 of the bottom one of the I/O bases 32. With the top end module 16, the controller assembly 12, the two I/O assemblies 14 and the bottom end module 18 so connected, the power bus and the communication bus extend from the top end module 16 down to the bottom end module 18. Power is supplied to the power bus from the module power supply 169 connected to the power connector 168 of the top end module 16.

With power being supplied to the module row 8 and the control system 10 operating to control the industrial process, the I/O modules 30 and the controller modules 50 generate heat that rises. Thus, heat generated from a bottom one of the I/O modules 30 rises toward a top one of the I/O modules 30. Similarly, heat generated from the top one of the I/O modules 30 rises toward the controller modules 50. Without the air deflectors 122, 152, the air rising from the modules would get progressively warmer as it traveled through the modules from bottom to top. By the time the air reached the controller modules 50, the air would be quite warm, which could adversely affect the operation of the controller modules 50. This is especially true when the module row 8 includes substantially more I/O assemblies 14, which is typical. The air deflectors 122, 152, however, reduce this progressive warming of upwardly flowing air.

Figure 14:
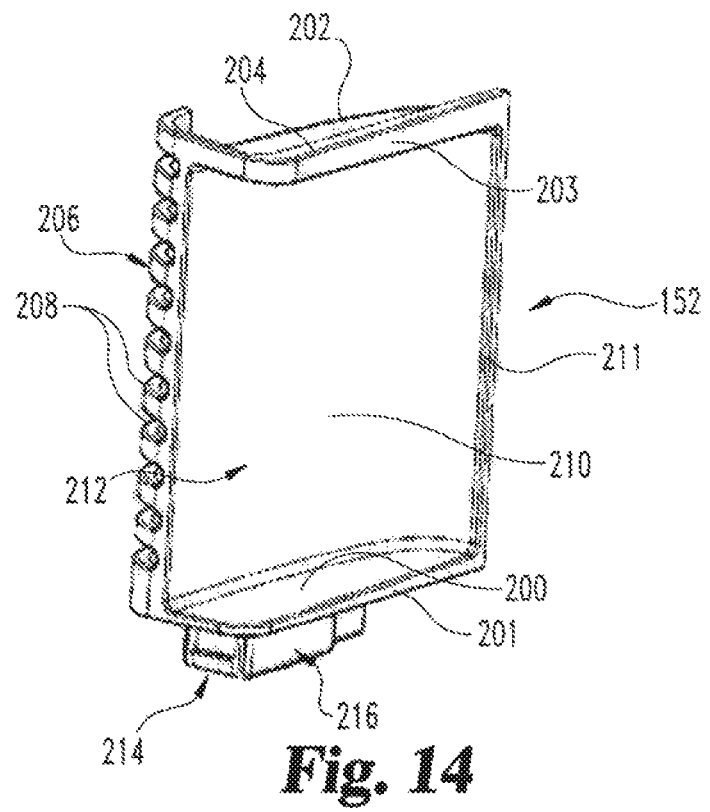
FIG. 14 shows a perspective view of the first air flow deflector.
Figure 15:
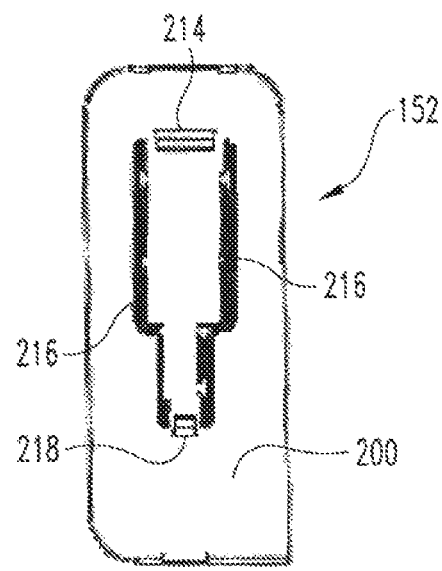
FIG. 15 shows a bottom plan view of a base wall of the first air flow deflector.

Referring now to FIGS. 14 and 15, the air deflector 152 is shown. The air deflector 152 includes a generally rectangular base wall 200 and an opposing outer wall 202 having an L-shaped flange 204. An arcuate or curved baffle 206 extends between the base wall 200 and the outer well 202. The baffle 206 has an inner end joined to the base wall 200 and an outer end joined to the L-shaped flange 204 of the outer wall 202. The baffle 206 has a series of openings 208 formed therein that extend through the baffle. An arcuate or curved blocking wall 210 also extends between the base wall 200 and the outer wall 202 along the baffle 206. Blocking wall 210 lacks any openings. The base wall 200, the outer wall 202 and the blocking wall 210 define a recess 212. A series of mounting projections 214, 216, 218 extend from the base wall 200. The mounting projections 214, 216, 218 are not connected together and can be deflected. At least the mounting projections 214, 218 have a free end with a barb and are configured to act as snap-fit connectors that engage edges in the controller base 52 forming the mounting opening 151. A top edge 201 of the base wall 200, a top edge 203 of the flange 204 and a top edge 211 of the blocking wall 210 form an outer peripheral edge 219 with portions (201, 203) disposed on opposing sides of the recess 212.

Figure 16:
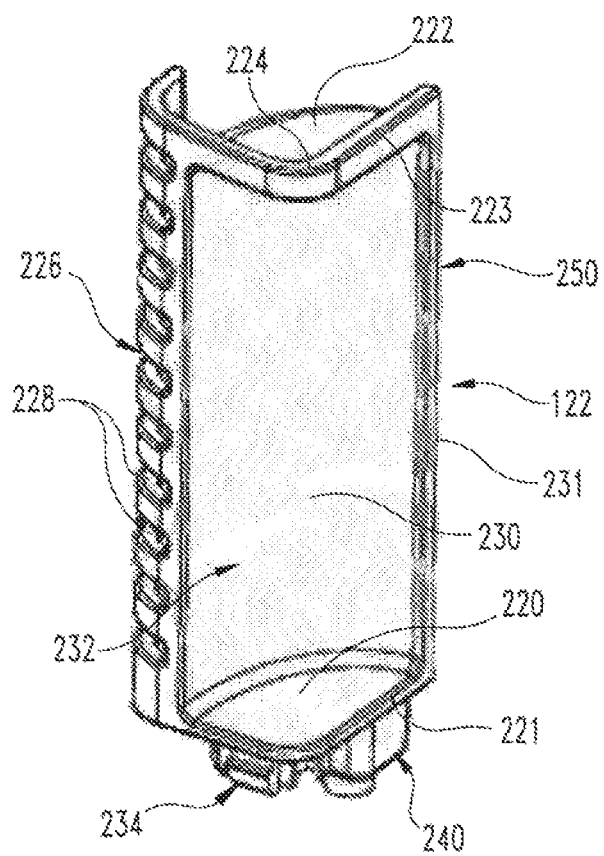
FIG. 16 shows a perspective view of a second air flow deflector.
Figure 17:
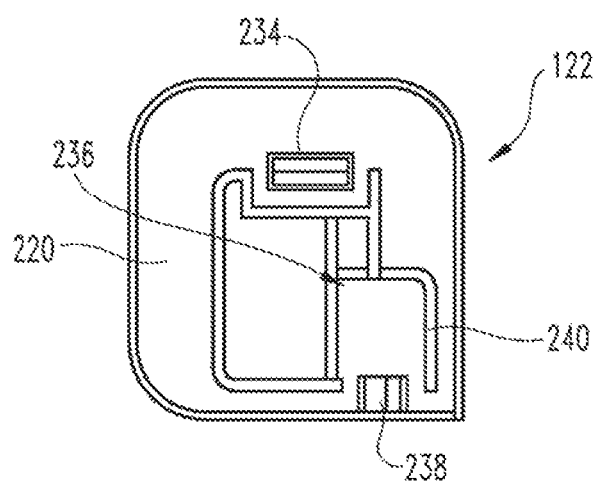
FIG. 17 shows a bottom plan view of a base wall of the second air flow deflector.

Referring now to FIGS. 16 and 17, the air deflector 122 is shown. The air deflector 122 has a similar construction as the air deflector 152, except it is narrower because it only covers the width of a single I/O module 30. The air deflector 122 includes a generally square base wall 220 and an opposing outer wall 222 having an L-shaped flange 224. An arcuate or curved baffle 226 extends between the base wall 220 and the outer wall 222. The baffle 226 has an inner end joined to the base wall 220 and an outer end joined to the L-shaped flange 224 of the outer wall 222. The baffle 226 has a series of openings 228 formed therein that extend through the baffle. An arcuate or curved blocking wall 230 also extends between the base wall 220 and the outer wall 222 along baffle 226 and lacks any openings. The base wall 220, the outer wall 222 and the blocking wall 230 define a recess 232. A series of mounting projections 234, 236, 238, 240 extend from the base wall 220. The mounting projections 234, 238 are free standing and can be deflected. At least the mounting projections 234, 238 have a free end with a barb and are configured to act as snap-fit connectors that engage edges in the I/O base 32 forming the mounting opening 120. A top edge 221 of the base wall 220, a top edge 223 of the flange 224 and a top edge 231 of the blocking wall 230 form an outer peripheral edge 250 with portions (221, 223) disposed on opposing sides of the recess 232.

Figure 18:
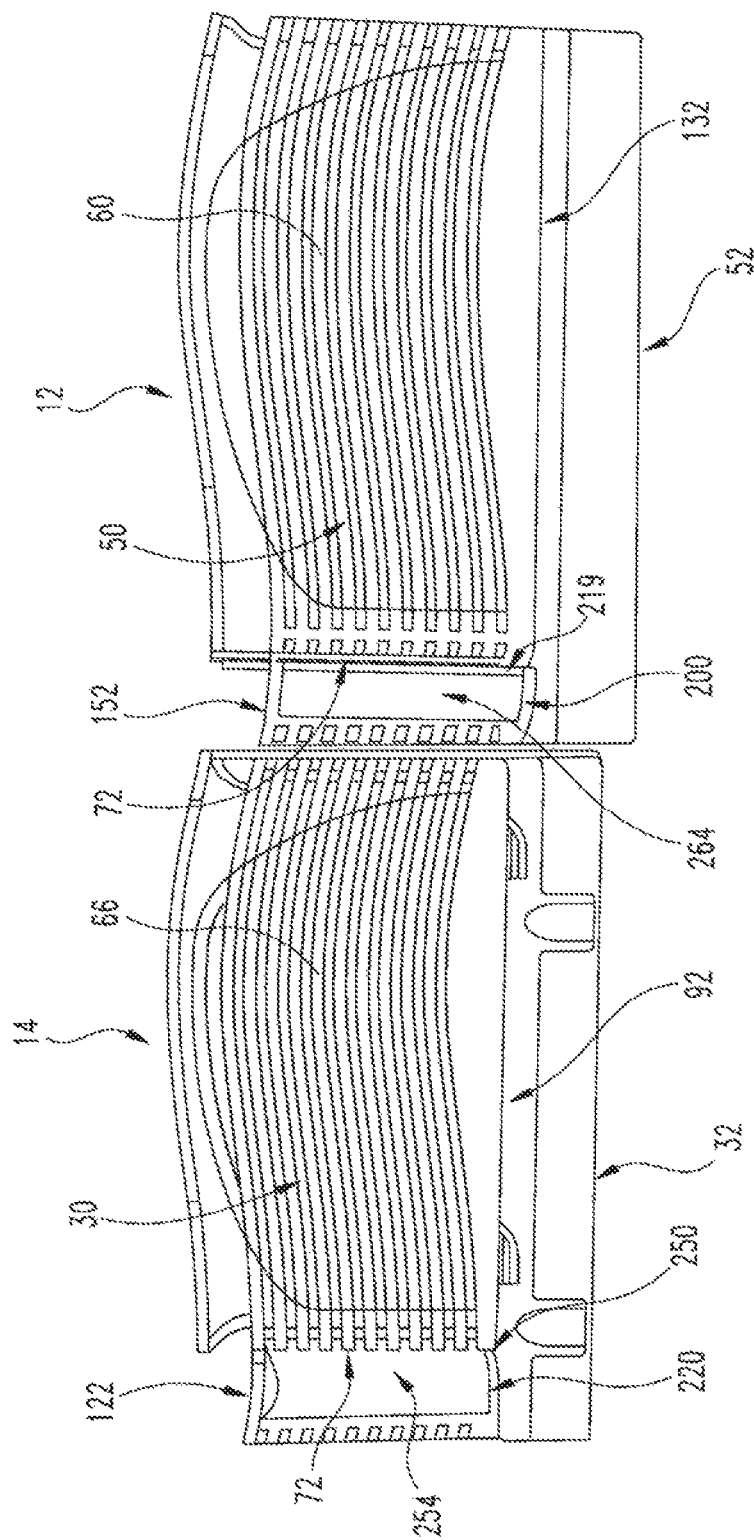
FIG. 18 shows a side view of a controller assembly connected to an I/O assembly of the control system.

Referring now to FIG. 18, the top one of the I/O assemblies 14 is shown connected to the controller assembly 12. The air deflector 122 is mounted to the I/O base 32, with the projections 234-240 being disposed in the mounting opening 120 of the cover 92 and at least the mounting projection 234, 238 engaging side edges defining the mounting opening 120, thereby releasably securing the air deflector to the I/O base 32. The base wall 220 abuts a top surface of the cover 92 of the I/O base 32. The outer peripheral edge 250 of the air deflector 122 is adjacent to and in close proximity to the bottom end 72 of the I/O module 30 mounted to the I/O base 32. With this arrangement, the air deflector 122 forms a pocket 254 with the bottom end 72 of the I/O module 30. The pocket 254 has a fresh air inlet opening defined by the portion of outer peripheral edge 250 that is disposed in a plane that is at least substantially parallel to the side wall 66 of the I/O module 30. In this manner, air from a direction to the right of the I/O module 30 enters the pocket 254 and is directed or deflected into the bottom openings 76 of the I/O module 30. As used herein, fresh air is air that is not passed through and warmed by an adjacent module. Moreover, the air deflector 122, and in particular, the blocking wall 230, blocks warm air exiting the I/O module 30 of the bottom one of the I/O assemblies 14 from entering the bottom openings 76 of the I/O module 30.

The air deflector 152 is mounted to the controller base 52, with the projections 214-218 being disposed in the mounting opening 151 of the cover 132 and at least the mounting projection 214, 218 engaging side edges defining the mounting opening 151, thereby releasably securing the air deflector 152 to the controller base 52. The base wall 200 abuts a top surface of the cover 132 of the controller base 52. The outer peripheral edge 219 of the air deflector 152 is adjacent to and in close proximity to the bottom ends 72 of the controller modules 50 mounted to the controller base 52. With this arrangement, the air deflector 152 forms a pocket 264 with the bottom ends 72 of the controller modules 50. The pocket 264 has a fresh air inlet opening defined at least in part by outer peripheral edge 219 that is disposed in a plane that is at least substantially parallel to the side wall 66 of the outer controller module 50. In this manner, air from a direction to the right of the outer controller module 50 enters the pocket 264 and is directed or deflected into the bottom openings 76 of the controller modules 50. Moreover, the air deflector 152, and in particular, the blocking wall 210, blocks warm air exiting the I/O module 30 of the upper one of the I/O assemblies 14 from entering the bottom openings 76 of the controller modules 50.

Various aspects of the present disclosure are contemplated. According to one aspect, a control system for mounting to a rail is disclosed. The control system includes a base including a mounting structure, a socket and a body having a channel formed therein that is adapted to receive the rail. The control system also includes a module for removable mounting to the socket of the base. The module includes circuitry for processing control signals and a housing enclosing the circuitry. The housing includes first and second sides and first and second ends and at least the first end includes openings therein to permit air to flow into the housing and over the circuitry. The system also includes an air flow deflector adapted for mounting to the mounting structure of the base. The air flow deflector includes at least one wall defining a recess and includes an outer peripheral edge with portions disposed on opposing sides of the recess. When the module is mounted to the socket of the base and the air flow deflector is mounted to the mounting structure of the base, the outer peripheral edge is disposed adjacent to the first end of the module such that the air flow deflector forms a pocket with the first end of the module. The pocket includes an opening for receiving a fresh air flow disposed in a plane that is at least substantially parallel to at least one of the first and second sides of the module.

In one embodiment, the rail extends vertically and the channel in the base extends vertically. In another embodiment, power to the module and communication to and from the module are routed through the base. In yet another embodiment, the module further includes a plug adapted to be received in the socket of the base to establish communication between the base and the module.

In another embodiment, the base includes at least one connector for establishing communication between the base and one or more other devices. In a refinement of this embodiment, the connector is a terminal block for connection to ends of wires that are connected at opposite ends thereof to the one or more other devices. In a further refinement, the one or more other devices are field devices and the module is an I/O module that processes and conditions field inputs received from the field devices or control outputs received from a controller module. In another refinement of the embodiment, the module is a controller module and the connector is an Ethernet jack for receiving a plug of an Ethernet cable having another plug connected to another controller module or to an operator workstation.

In another embodiment, the base is a first base and the module is a first module. The control system further includes a second base including a second mounting structure, a second socket, and a second body including a second channel formed therein that is adapted to receive the rail. The control system also includes a second module for removable mounting to the second socket of the second base. The second module includes circuitry for processing control signals and a second housing enclosing the circuitry. The second housing includes opposite sides and opposite ends, and at least one of the opposite ends includes second openings therein to permit air to flow into the second housing and over the circuitry. The control system also includes a second air flow deflector adapted for mounting to the second mounting structure of the second base. The second air flow deflector includes at least one wall defining a second recess and includes a second outer peripheral edge with portions disposed on opposing sides of the second recess. When the second module is mounted to the second socket of the second base and the second air flow deflector is mounted to the second mounting structure of the second base, the second outer peripheral edge is disposed adjacent to the one of the opposite ends of the second module including the second openings such that the second air flow deflector forms a second pocket with the one of the opposite ends of the second module. The second pocket includes a second opening for receiving a second fresh air flow and the second opening is substantially parallel to the opening of the module.

In a refinement of this embodiment, the first and second bases each further include plugs disposed on opposing sides of respective ones of the first and second bodies thereof. One of the plugs of the first base and one of the plugs of the second base are adapted to connect to each other to form a power bus and a communication bus extending through the first and second bases. In a further refinement, the first module is a controller module that includes a processor operable to execute control programs, and the second module is an I/O module that includes circuitry for processing and conditioning field inputs received from the field devices or control outputs received from the controller module.

In another embodiment, the at least one well of the air flow deflector includes a base wall and an outer wall opposite the base wall, and the at least one wall further includes a baffle extending between the base wall and the outer wall. In a refinement of this embodiment, the baffle includes a series of openings therethrough. In a further refinement, the opening of the pocket is located between the first end of the housing and the baffle. In another refinement, the at least one wall includes a blocking wall extending between the base wall and the outer wall along the baffle.

In another refinement of the above embodiment, the base wall includes a series of deflectable mounting projections extending therefrom, the mounting structure of the base includes a mounting opening, and the mounting projections are received in the mounting opening to mount the air flow deflector to the mounting structure of the base. In a further refinement, opposite ones of the mounting projections each include a free end with a barb that provides a snap fit to engage the mounting structure in the mounting opening. In yet another refinement of the above embodiment, the outer peripheral edge includes an L-shaped flange along the outer wall and the baffle is joined with the L-shaped flange.

According to another aspect a control system is provided with a first I/O assembly and a second I/O assembly. The first I/O assembly includes a first base mounted to an elongated rail and a first module mounted to the base. The first module includes circuitry for processing control signals. The first module extends between a first end and an opposite second end, and the first end includes openings therein to permit air to flow over the circuitry. The first I/O assembly further includes a first air flow deflector extending from the base. The first air flow deflector includes a blocking wall extending to an outer wall, and the first air flow deflector includes an outer peripheral edge around the blocking wall and the outer wall. The peripheral edge and blocking wall form a pocket with the first end of the first module. The second I/O assembly is mounted to the rail below the first I/O assembly. The second I/O assembly includes circuitry for processing control signals. The second I/O assembly further includes at least one opening oriented toward the first end of the first module, and the first air flow deflector also includes the blocking wall positioned to block warm air exiting the at least one opening of the second I/O assembly from entering the openings at the first end of the first module. The outer peripheral edge defines an opening into the pocket to receive a fresh air flow into the openings at the first end of the first module.

In one embodiment, the opening for receiving the fresh air flow parallels an adjacent side wall of the first module and the side wall is transversely oriented to the first end of the first module.

In another embodiment, the system includes a controller assembly mounted to the rail above the first I/O assembly. The controller assembly includes a controller base and a pair of controller modules mounted to the controller base in side-by-side relation. Each of the controller modules includes circuitry for processing control signals and each includes end openings in an end thereof that are oriented toward the second end of the first module. The end openings receive a second fresh air flow to provide cooling of the circuitry in each of the pair of controller modules.

In a refinement of the above embodiment, the system includes a second air flow deflector extending from controller base. The second air flow deflector includes a second blocking wall extending to a second outer wall. The second air flow deflector also includes a second outer peripheral edge around the second blocking wall and the second outer wall. The second peripheral edge and second blocking wall form a second pocket with the ends of the pair of controller modules, and the second peripheral edge defines a second opening to receive the second fresh air flow while the second blocking wall blocks warm air exiting the second end of the first module from entering the end openings of the pair of controller modules. In a refinement of this embodiment, the second air flow deflector includes a base wall opposite the second outer wall and a second baffle extending between the base wall and the second outer wall along the second blocking wall, and the second baffle includes a series of openings therethrough.

In another embodiment, the air flow deflector includes a base wall opposite the outer wall, and the base wall includes a series of deflectable mounting projections extending therefrom that are releasably engaged to the first base. In a refinement of this embodiment, opposite ones of the mounting projections each include a free end with a barb that provides a snap fit to engage the mounting structure in the mounting opening.

It is to be understood that the description of the foregoing exemplary embodiment(s) is (are) intended to be only illustrative, rather than exhaustive, of the present invention. Those of ordinary skill will be able to make certain additions, deletions, and/or modifications to the embodiment(s) of the disclosed subject matter without departing from the spirit of the invention or its scope, as defined by the appended claims. Furthermore, one or more features disclosed for one embodiment may be combined or included with any other embodiment unless noted otherwise.

What is claimed is:

1. A control system for mounting to a rail, the control system comprising:
    a base including a mounting structure, a socket, and a body including a channel formed therein that is adapted to receive the rail;
    a module for removable mounting to the socket of the base, the module comprising circuitry for processing control signals and a housing enclosing the circuitry, the housing including opposite first and second sides and opposite first and second ends, at least the first end including openings therein to permit air to flow into the housing and over the circuitry;
    an air flow deflector adapted for mounting to the mounting structure of the base, the air flow deflector comprising at least one wall defining a recess and including an outer peripheral edge with portions disposed on opposing sides of the recess; and
    wherein when the module is mounted to the socket of the base and the air flow deflector is mounted to the mounting structure of the base, the outer peripheral edge is disposed adjacent to the first end of the module such that the air flow deflector forms a pocket with the first end of the module, the pocket including an opening for receiving a fresh air flow disposed in a plane that is at least substantially parallel to at least one of the first and second sides of the module,
    wherein the at least one wall of the air flow deflector includes a base wall and an outer wall opposite the base wall, and the at least one wall further comprising a baffle extending between the base wall and the outer wall,
    wherein the baffle includes a series of openings therethrough.

2. The control system of claim 1, wherein the rail extends vertically and the channel in the base extends vertically.

3. The control system of claim 1, wherein power to the module and communication to and from the module are routed through the base.

4. The control system of claim 1, wherein the module further comprises a plug adapted to be received in the socket of the base to establish communication between the base and the module.

5. The control system of claim 1, wherein the base further comprises at least on connector for establishing communication between the base and one or more other devices.

6. The control system of claim 5, wherein the connector is a terminal block for connection to ends of wires that are connected at opposite ends thereof to the one or more other devices.

7. The control system of claim 6, wherein the one or more other devices are field devices and the module is an input/output (I/O) module that processes and conditions field inputs received from the field devices or control outputs received from a controller module.

8. The control system of claim 5, wherein the module is a controller module and the connector is an Ethernet jack for receiving a plug of an Ethernet cable having another plug connected to another controller module or to an operator workstation.

9. The control system of claim 1, wherein the base is a first base and the module is a first module, and wherein the control system further comprises:
    a second base including a second mounting structure, a second socket, and a second body including a second channel formed therein that is adapted to receive the rail;
    a second module for removable mounting to the second socket of the second base, the second module comprising circuitry for processing control signals and a second housing enclosing the circuitry, the second housing including opposite sides and opposite ends, at least one of the opposite ends including second openings therein to permit air to flow into the second housing and over the circuitry;
    a second air flow deflector adapted for mounting to the second mounting structure of the second base, the second air flow deflector comprising at least one wall defining a second recess and including a second outer peripheral edge with portions disposed on opposing sides of the second recess; and
    wherein when the second module is mounted to the second socket of the second base and the second air flow deflector is mounted to the second mounting structure of the second base, the second outer peripheral edge is disposed adjacent to the one of the opposite ends of the second module including the second openings such that the second air flow deflector forms a second pocket with the one of the opposite ends of the second module, the second pocket including a second opening for receiving a second fresh air flow, the second opening being substantially parallel to opening of the module.

10. The control system of claim 9, wherein the first and second bases each further comprise plugs disposed on opposing sides of respective ones of the first and second bodies thereof, wherein one of the plugs of the first base and one of the plugs of the second base are adapted to connect to each other to form a power bus and a communication bus extending through the first and second bases.

11. The control system of claim 10, wherein the first module is a controller module that includes a processor operable to execute control programs, and wherein the second module is an input/output (I/O) module that includes circuitry for processing and conditioning field inputs received from field devices or control outputs received from the controller module.

12. The control system of claim 1, wherein the opening of the pocket is located between the first end of the housing and the baffle.

13. The control system of claim 1, wherein the at least one wall includes a blocking wall extending between the base wall and the outer wall along the baffle.

14. A control system for mounting to a rail, the control system comprising:
a base including a mounting structure, a socket, and a body including a channel formed therein that is adapted to receive the rail;
a module for removable mounting to the socket of the base, the module comprising circuitry for processing control signals and a housing enclosing the circuitry, the housing including opposite first and second sides and opposite first and second ends, at least the first end including openings therein to permit air to flow into the housing and over the circuitry;
an air flow deflector adapted for mounting to the mounting structure of the base, the air flow deflector comprising at least one wall defining a recess and including an outer peripheral edge with portions disposed on opposing sides of the recess; and
wherein when the module is mounted to the socket of the base and the air flow deflector is mounted to the mounting structure of the base, the outer peripheral edge is disposed adjacent to the first end of the module such that the air flow deflector forms a pocket with the first end of the module, the pocket including an opening for receiving a fresh air flow disposed in a plane that is at least substantially parallel to at least one of the first and second sides of the module,
wherein the at least one wall of the air flow deflector includes a base wall and an outer wall opposite the base wall, and the at least one wall further comprising a baffle extending between the base wall and the outer wall,
wherein the base wall includes a series of deflectable mounting projections extending therefrom, the mounting structure of the base includes a mounting opening, and the mounting projections are received in the mounting opening to mount the air flow deflector to the mounting structure of the base.

15. The control system of claim 14, wherein opposite ones of the mounting projections each include a free end with a barb that provides a snap fit to engage the mounting structure in the mounting opening.

16. A control system for mounting to a rail, the control system comprising:
a base including a mounting structure, a socket, and a body including a channel formed therein that is adapted to receive the rail;
a module for removable mounting to the socket of the base, the module comprising circuitry for processing control signals and a housing enclosing the circuitry, the housing including opposite first and second sides and opposite first and second ends, at least the first end including openings therein to permit air to flow into the housing and over the circuitry;
an air flow deflector adapted for mounting to the mounting structure of the base, the air flow deflector comprising at least one wall defining a recess and including an outer peripheral edge with portions disposed on opposing sides of the recess; and
wherein when the module is mounted to the socket of the base and the air flow deflector is mounted to the mounting structure of the base, the outer peripheral edge is disposed adjacent to the first end of the module such that the air flow deflector forms a pocket with the first end of the module, the pocket including an opening for receiving a fresh air flow disposed in a plane that is at least substantially parallel to at least one of the first and second sides of the module,
wherein the at least one wall of the air flow deflector includes a base wall and an outer wall opposite the base wall, and the at least one wall further comprising a baffle extending between the base wall and the outer wall,
wherein the outer peripheral edge includes an L-shaped flange along the outer wall and the baffle is joined with the L-shaped flange.

17. A control system, comprising:
a first input/output (I/O) assembly including a first base mounted to an elongated rail and a first module mounted to the base, the first module comprising circuitry for processing control signals, the first module extending between a first end and an opposite second end, the first end including openings therein to permit air to flow over the circuitry, the first I/O assembly further including a first air flow deflector extending from the base, the first air flow deflector including a blocking wall extending to an outer wall, the air flow deflector including an outer peripheral edge around the blocking wall and the outer wall, the peripheral edge and blocking wall forming a pocket with the first end of the first module;
a second I/O assembly mounted to the rail below the first I/O assembly, the second I/O assembly comprising circuitry for processing control signals, the second I/O assembly including at least one opening oriented toward the first end of the first module, wherein the first air flow deflector includes the blocking wall positioned to block warm air exiting the at least one opening of the second I/O assembly from entering the openings at the first end of the first module, and further wherein the outer peripheral edge defines an opening into the pocket to receive a fresh air flow into the openings at the first end of the first module; and
a controller assembly mounted to the rail above the first I/O assembly, wherein the controller assembly includes a controller base and a pair of controller modules mounted to the controller base in side-by-side relation, each of the controller modules including circuitry for processing control signals and each including end openings in an end thereof that are oriented toward the second end of the first module, the end openings receiving a second fresh air flow to provide cooling of the circuitry in each of the pair of controller modules.

18. The control system of claim 17, wherein the opening for receiving the fresh air flow parallels an adjacent side wall of the first module and the side wall is transversely oriented to the first end of the first module.

19. The control system of claim 17, further comprising a second air flow deflector extending from controller base, wherein the second air flow deflector includes a second blocking wall extending to a second outer wall, the second air flow deflector including a second outer peripheral edge around the second blocking wall and the second outer wall, the second outer peripheral edge and second blocking wall forming a second pocket with the ends of the pair of controller modules, and the second outer peripheral edge defines a second opening to receive the second fresh air flow while the second blocking wall blocks warm air exiting the second end of the first module from entering the end openings of the pair of controller modules.

20. The control system of claim 19, wherein the second air flow deflector includes a base wall opposite the second outer wall and a second baffle extending between the base wall and the second outer wall along the second blocking wall, the second baffle including a series of openings therethrough.

21. A control system, comprising:
- a first input/output (I/O) assembly including a first base mounted to an elongated rail and a first module mounted to the base, the first module comprising circuitry for processing control signals, the first module extending between a first end and an opposite second end, the first end including openings therein to permit air to flow over the circuitry, the first I/O assembly further including a first air flow deflector extending from the base, the first air flow deflector including a blocking wall extending to an outer wall, the air flow deflector including an outer peripheral edge around the blocking wall and the outer wall, the peripheral edge and blocking wall forming a pocket with the first end of the first module; and
- a second I/O assembly mounted to the rail below the first I/O assembly, the second I/O assembly comprising circuitry for processing control signals, the second I/O assembly including at least one opening oriented toward the first end of the first module, wherein the first air flow deflector includes the blocking wall positioned to block warm air exiting the at least one opening of the second I/O assembly from entering the openings at the first end of the first module, and further wherein the outer peripheral edge defines an opening into the pocket to receive a fresh air flow into the openings at the first end of the first module, wherein the air flow deflector includes a base wall opposite the outer wall, the base wall including a series of deflectable mounting projections extending therefrom that are releasably engaged to the first base.

22. The control system of claim 21, wherein opposite ones of the mounting projections each include a free end with a barb that provides a snap fit to engage the mounting structure in the mounting opening.

* * * * *